US005670262A

United States Patent [19]

Dalman

[11] Patent Number: 5,670,262
[45] Date of Patent: Sep. 23, 1997

[54] PRINTING WIRING BOARD(S) HAVING POLYIMIDEBENZOXAZOLE DIELECTRIC LAYER(S) AND THE MANUFACTURE THEREOF

[75] Inventor: David A. Dalman, Midland, Mich.

[73] Assignee: The Dow Chemical Company, Midland, Mich.

[21] Appl. No.: 437,710

[22] Filed: May 9, 1995

[51] Int. Cl.$^6$ .............................. B32B 15/08; H05K 1/02
[52] U.S. Cl. .................. 428/458; 428/209; 428/332; 428/457; 428/473.5; 428/901; 361/750
[58] Field of Search ................................. 428/209, 901, 428/457, 458, 473.5, 332; 528/128, 353; 361/748, 750

[56] References Cited

U.S. PATENT DOCUMENTS

| | | | |
|---|---|---|---|
| 4,376,195 | 3/1983 | Lee | 528/353 |
| 4,487,911 | 12/1984 | Lange et al. | 528/125 |
| 4,705,720 | 11/1987 | Kundinger | 428/332 |
| 4,871,595 | 10/1989 | Lusignea et al. | 428/1 |
| 4,943,471 | 7/1990 | Uekita et al. | 428/220 |
| 4,980,447 | 12/1990 | Khanna | 528/184 |
| 5,037,876 | 8/1991 | Birkle et al. | 524/496 |
| 5,071,948 | 12/1991 | Khanna | 528/331 |
| 5,098,985 | 3/1992 | Harris | 528/128 |
| 5,112,462 | 5/1992 | Swisher | 205/165 |
| 5,248,760 | 9/1993 | DuBois et al. | 528/353 |
| 5,290,909 | 3/1994 | Chen | 528/353 |

OTHER PUBLICATIONS

Jerry Murray, "PCB Laminates," PC FAB, Mar. 1991, pp. 42–47.
David J. Powell, "A New, Non-Woven Aramid Reinforcement for PWBs and MCM-L's," Circuitree, Nov. 1994, pp. 50 & 52.
Thomas Noll, Kent Blizard, J. Jayaraj and L.S. Rubin, "Controlled Thermal Expansion Printed Wiring Boards Based on Liquid Crystal Polymer Dielectrics," IEPS Conference, 9/15–18/91.
Coombs, Printed Circuit Handbook, 1988, pp. 3.22–3.23.

*Primary Examiner*—Marie Yamnitzky

[57] ABSTRACT

A film of polyimidebenzoxazole (PIBO) having an electrically conductive layer adhered to at least one face thereto, wherein the PIBO film has a tensile strength greater than 200 MPa. A printed wiring board having at least one dielectric layer and at least one circuitry layer wherein at least one dielectric layer is a PIBO film. A printed wiring board (PWB) having at least one polyimidebenzoxazole (PIBO) dielectric layer wherein the PWB has at least one thin dielectric base material layer, at least one thin conductor, at least one narrow conductor width and at least one small diameter via.

33 Claims, No Drawings

PRINTING WIRING BOARD(S) HAVING POLYIMIDEBENZOXAZOLE DIELECTRIC LAYER(S) AND THE MANUFACTURE THEREOF

FIELD OF THE INVENTION

The present invention relates to printed wiring boards and the use of polymers as the base material in panels used to manufacture printed wiring boards.

BACKGROUND OF THE INVENTION

A printed wiring board is typically made from at least one basic building block referred to in the industry as a panel. A panel is a sheet of specific size comprised of a conductive layer adhered to and completely covering one or both faces of a dielectric layer. Panels are commonly thin squares or rectangles having sides ranging in length from about 300 to 700 millimeters and a thickness of less than about 0.3 millimeters. The uninterrupted conductive layer is commonly referred to as cladding or clad. The panel dielectric layer is typically called a base material layer. The cladding thickness commonly ranges between 17 to 50 microns. The base material layer thickness commonly ranges between 75 to 150 microns. Epoxy impregnated woven glass mats (glass-epoxy) are generally used as the base material. Copper is generally used for the cladding.

A printed wiring board (PWB) is a sheet of specific shape and size in which electrical components can be mounted to create a functioning electronic device, such as a computer memory module. The PWB gives mechanical support to and electrically interconnects the mounted electrical components, such as capacitors, resistors and integrated circuit chips (ICs). The PWB can also provide the means to connect said components to electrical power, ground and a greater device such as a computer. A PWB having at least two ICs is called a multichip module (MCM).

There are three types of printed wiring boards (PWBs): single-sided, double-sided, and multilayered. The single-sided PWB has one dielectric base material layer and one circuitry layer. A circuitry layer is a conductive layer of a PWB containing one or more electrical circuits connecting the mounted components and/or providing connections to power and ground of a greater device such as a computer. The double-sided PWB has one dielectric base material layer and two circuitry layers. A multilayered printed wiring board is a laminate of alternating dielectric layers and circuitry layers, wherein the dielectric layers can be dielectric base material layers or dielectric adhesive layers. The dielectric adhesive layers generally are used to bond together the multiple layers used in fabricating a multilayer PWB. Before being laminated, the dielectric adhesive layers which are in the form of a film are commonly called prepregs.

A circuitry layer is comprised of features called conductors which form the printed circuit [i.e., electrical circuit(s)]. A conductor is an electrically conductive area on a printed wiring board circuitry layer. Examples of a conductor include a line (analogous to a wire), a land (an area where electrical components such as ICs, capacitors, and resistors are connected to a PWB), a via (a metal plated hole interconnecting at least two circuitry layers) and an annular ring. An annular ring is the conductor surrounding a via on a circuitry layer.

The circuitry layer features are also described by their dimensional characteristics. For example, conductor spacing is the nearest edge-to-edge distance between two adjacent conductor elements, pitch is the distance from the center of one conductor line to the center of an adjacent line, and conductor width is the distance from one edge to the opposing edge of an individual conductor.

Generally, a PWB circuitry layer is created in the cladding of a panel by a photoresist/etching process. Typically, a panel is cut into more than one single-sided or double-sided PWB. A dielectric layer having at least one PWB circuitry layer present on its surface will be hereinafter referred to as a processed panel, wherein the circuitry layer is not in a state to accept electrical componentry but can be laminated with other processed panels in the production of multilayer PWBs (see ensuing step 12). The typical steps to make a double-sided PWB from a copper clad panel using a photoresist/etching process as described by, *Printed Circuit Board Basics 2nd Ed.*, M. Flatt, Miller Freeman, San Francisco, 1992, are:

1) cladding type/thickness, epoxy type/thickness and panel size are specified;
2) holes are drilled in the panel;
3) copper is electroless plated on the panel surfaces including inner hole surfaces;
4) photoresist (plating resist) is applied to the surface of the panel cladding;
5) a mask of the circuitry pattern is placed on the panel;
6) the masked panel is exposed to light (typically UV light) photo-reproducing the circuitry in the photoresist;
7) the areas of photoresist not exposed to the light are etched away leaving bare copper circuitry in the cladding surrounded by copper covered with photoresist;
8) copper is electroplated onto the bare copper circuitry formed in step 7;
9) etch resist (e.g., tin, tin/lead) is electroplated onto the copper circuitry formed in step 8;
10) the exposed photoresist is chemically removed/etched leaving bare copper and the copper circuitry covered with etch resist;
11) the bare copper in step 10 is chemically removed leaving the copper circuitry covered with etch resist;
12) the etch resist is chemically removed leaving the copper circuitry on the panel surface.

At this point, a processed panel has been created. Further steps are generally required to make a double-sided PWB which is ready to mount components and these steps are:

13) another photoresist (solder resist) is applied to the panel surface;
14) a mask of a pattern detailing the areas where solder will be bonded to the surface of the copper circuitry is placed on the panel;
15) the masked panel is exposed to light as in step 6;
16) the areas of photoresist unexposed to light are chemically removed; leaving areas of bare copper and copper coated with solder resist;
17) solder is electroplated onto the bare copper areas formed in step 16 and
18) the panel is sliced and finished into individual PWBs.

A typical multilayer printed wiring board is formed by laminating two processed panels having circuitry layers on both sides as described by step 12 in the above procedure. These processed panels are usually laminated together using a prepreg. In forming PWBs containing glass-epoxy base materials, the prepreg is usually a partially cured glass-epoxy film. The processed panels are further prepared for laminating by treating the circuitry layers with a compound to facilitate the bonding of the circuitry layers to the prepreg. Alternating layers of the processed panels and prepregs are placed in a die. In addition to the processed panels and prepregs, it is common to have a prepreg and then a metal foil layer (typically copper) as the bottom and top layers in the die. The prepregs, processed panels and metal foil are laminated by applying heat and pressure to the die. After laminating, the prepreg and foil create an outer cladding on the laminate. The laminate is then processed using the above double-sided PWB process or analogous process to form multilayer PWBs.

As electronic devices, such as computers and cellular phones, decrease in size while computing speed and capacity continue to increase, printed wiring boards have had to increase in circuit density and decrease in volume. PWB circuit density is described by and is proportional to the number of component connecting leads which can be attached to a square inch of PWB surface. Increasing PWB circuit density and decreasing volume have necessitated the use of thinner dielectric base material layers, thinner cladding layers, closer conductor spacing, narrower conductor width, and smaller diameter via holes.

As the development of higher circuit density multichip modules (MCMs) proceeds, direct surface mount chip technology, such as tab lead frame, wire bond and flip chip mounting is increasingly being used; chip being short for an IC chip. Because the chips are direct surface mounted and MCMs exhibit substantial thermal cycling in service, a wiring board-chip coefficient of thermal expansion (CTE) mismatch can cause chip failure or chip to PWB interconnection failure. Thus, the CTE in the XY plane needs to approach that of the chips to avoid breakage of the chip and/or the connections between the board and chip during operation. The XY plane is the same as the plane defined by a PWB circuitry and base material layer. This requires the base material layer to have an XY CTE close to that of a silicon based IC chip.

A critical aspect in creating a PWB is the degree of conformity of circuit features, such as vias, to their intended position relative to other features of the PWB. The degree of conformity to an intended position is called registration. PWB defects arising from inadequate registration often occur during lamination. Poor registration occurs during lamination due to permanent base material distortion and induced stresses. The induced stresses arise from a coefficient of thermal expansion (CTE) mismatch between the base material and circuitry layers. Therefore, it is advantageous to have a base material layer having sufficient stiffness and strength to resist stress-induced registration deficiencies such as warping. It is also advantageous to have a base material which exhibits minimal permanent deformation such as shrinkage during the lamination process.

Commercially available dielectric base materials are beginning to limit further reductions of PWB size, increases of PWB circuit density, and increases of PWB high frequency signal propagation speed. Glass-epoxy base material layers exhibit periodic roughness associated with a reinforcing woven glass mat. This roughness limits how thin the base material and cladding can be which ultimately determines how thin the circuitry can be. In addition, a glass-epoxy layer typically has a linear coefficient of thermal expansion (CTE) between 12 to 17 parts per million (ppm)/° C. in the XY plane whereas an IC made out of silicon has a CTE on the order of 3 ppm/° C. This mismatch can cause chip or chip to PWB interconnection failure. Glass-epoxy base materials have a high dielectric constant of about 4.5.

This high dielectric constant significantly slows signal propagation of high frequency circuits. In addition, due to the glass reinforcement, a glass-epoxy base material causes faster drill bit wear than a polymeric base material.

More recent base materials have attempted to address some of the problems associated with glass-epoxy base materials. For example, fiber reinforced (Kevlar and graphite reinforced) polyimide base materials have been developed. However, these materials have several disadvantages such as high moisture absorption, high cost, high dielectric constant (>3), and Kevlar has shown inferior adhesion to copper cladding.

Filled polytetrafluoroethylene (PTFE) has also been used to address limitations of a glass-epoxy base material (e.g., high dielectric constant). Fillers are required in PTFE because of its low inherent stiffness. PTFE fillers tend to cause the same problems glass reinforcement causes in glass-epoxy base material layers. PTFE base materials also display large lateral deformation in the XY plane with respect to temperature. PTFE's large lateral deformation limits the registration attainable in a multilayer PWB.

Liquid crystal polymer (LCP) base materials have recently been developed. LCPs typically are stiff strong polymers often having a dielectric constant less than 3. However, LCPs tend to lack good adhesion to metal cladding. Also, LCPs generally exhibit anisotropic coefficients of thermal expansion (CTE). In particular, LCPs tend to exhibit Z direction CTE significantly higher than the CTE of copper. The Z direction is perpendicular to the XY plane. Due to thermal cycling during MCM operation, the copper-LCP CTE mismatch causes stress and can fracture a via's copper plating. As the via diameter decreases, the via copper plating stress will be increased by the inverse square of the via diameter. Consequently, it will be difficult to make reliable small diameter vias in a multilayer PWB having LCP base material layers.

Therefore, it is desirable to furnish a panel capable of being formed into a single-sided, double-sided or multilayered PWB which can have high circuit density and fast high frequency signal propagation. Consequently, the PWB, and in particular the multilayer PWB of this invention can be made having thin base material layers, thin circuitry layers, narrow conductor widths, close conductor spacings and small diameter vias.

SUMMARY OF INVENTION

An aspect of this invention is a film of polyimidebenzoxazole (PIBO) having an electrically conductive layer adhered to at least one face thereto, wherein the PIBO film has a tensile strength greater than about 200 MPa at 25° C. The tensile strength is determined by ASTM D-638-B7B. The PIBO film having an electrically conductive layer bonded thereto can be a panel, sheet, or processed panel.

Another aspect of this invention is a printed wiring board having at least one dielectric layer and at least one circuitry layer wherein at least one dielectric layer is a PIBO film having a tensile strength greater than about 200 MPa at 25° C. as determined by ASTM D-638-87B. The previous aspect of this invention can be used to make said PWB.

With this invention, it is possible to fabricate a PWB having a thinner dielectric base material layer, a thinner conductor, a closer conductor spacing, a narrower conductor width and a smaller diameter via, compared to glass-epoxy technology. Consequently, using this invention one may fabricate small, high circuit density, fast signal propagating MCMs which can meet the expected size reductions and computing requirements of present and future electronic devices.

DETAILED DESCRIPTION OF THE INVENTION

In the first aspect of this invention, the PIBO film adhered to one or two electrically conductive layers can be, for example, long sheets, panels or processed panels. The long sheets may be rolled. To minimize slicing, the width of the cladded PIBO sheet is preferably the same width as a specified panel.

The electrically conductive layer can be any electrically conductive metal. Preferably the metal is copper, aluminum or alloys thereof.

The electrically conductive layer is preferably less than about 50 microns and more preferably less than 17 microns thick.

It is advantageous to have a thin base material bonded to a thin cladding or a thin circuitry layer to create a small high circuit density PWB. PIBO films as thin as about 0.1 micron and as thick as about 2000 microns can be used. The preferred thickness of the PIBO film used as a base material layer is less than about 125 microns and the most preferred is a thickness less than about 50 microns. Because of PIBO stiffness, high strength, and surface smoothness, a thin base material layer of about 25 microns or less is possible. However, it is preferred that the PIBO film have a thickness of at least 5 microns.

The PIBO film may have a filler such as glass fibers and ceramic particulates. However, it is preferred to use the PIBO film without fillers. Base material layers without filler typically have smoother surfaces compared to base material layers having filler. Smoother surfaces enable thinner circuitry layers.

Any PIBO polymer may be a film and function as a PWB dielectric layer. It is preferred the PIBO have at least one of these physical properties: high stiffness, high strength, low dielectric constant, XY plane CTE approaching the CTE of silicon, Z plane CTE of less than about 100 ppm/° C. and low permanent deformation upon heating to about 300° C. A filler may be used to achieve one or more of the preferred properties, but it is preferred a PIBO film without filler meet the preferred property limitations.

Polyimidebenzoxazole is typically made by imidizing a polyamic acid which is the reaction product of a dianhydride monomer and a diaminobenzoxazole monomer. Imidization is the condensation reaction of the amic acid linkages of the polyamic acid, which consequently forms the imide linkages of the polyimidebenzoxazole. In copending applications, Ser. No. 331,775, filed Oct. 31, 1994, for "Polyamic Acids and Methods to Convert Polyamic Acids into Polyimide-benzoxazole Films" and "Polymeric Acid Precursors and Methods For Preparing Higher Molecular Weight Polyamic Acids and Polyimidebenzoxazole," filed Apr. 24, 1995 (Ser. No. 428,815 not), procedures and reactants to form PIBO films are described and are incorporated by reference. Preferred polyamic acids, in which a PIBO film is prepared therefrom, are the reaction products of: pyromellitic dianhydride and 5-amino-2-(p-aminophenyl)benzoxazole, pyromellitic dianhydride and 2,6-(4,4'-diaminodiphenyl)benzo[1,2-d:5,4-d'] bisoxazole, and pyromellitic dianhydride and 2,2'-p-phenylene-bis(5-aminobenzoxazole).

Because it is beneficial to have a stiffer and stronger base material layer, particularly for a rigid PWB, a PIBO film exhibiting an elastic modulus of about 0.5 GPa or greater is preferred. A tensile strength of about 250 MPa or greater, as determined by ASTM D-638-87B, is also preferred. A PIBO film having an elastic modulus of greater than about 5 GPa is more preferable. A PIBO film having a tensile strength greater than about 300 MPa is also more preferable.

To minimize failures of surface mounted IC chips, it is preferred the PIBO film used as a base material layer have an XY plane linear CTE between about 1 and about 7 ppm/° C. from about −55° C. to 125° C. It is preferred that the PIBO film have a Z direction CTE of less than about 100 ppm/° C. from about −55° C. to 125° C.

To allow faster signal propagation at higher frequencies, it is preferred the PIBO film have a dielectric constant between about 2 and 3.3 from about 1 MHz to 1GHz. The PIBO film dissipation factor is preferred to be at most 0.01 as determined by test IPC 650 2.5.8A.

To minimize registration problems, PIBO film having a permanent lateral deformation of less than about 0.02 percent determined by IPC 650 2.2.4A is also preferred.

To make the first aspect of this invention a PIBO film must be formed. Typically, to make a PIBO film, a polyamic acid is made by reacting a dianhydride monomer and a diaminobenzoxazole monomer in a solvent. The resultant polyamic acid is typically soluble in the solvent. The polyamic acid/solvent will be referred to as the polyamic acid solution. The polyamic acid solution or a PIBO solution formed by imidizing the polyamic acid in solution is then shaped into a film. When the polyamic acid solution is made into a film, it is subsequently imidized to form the PIBO film. The PIBO film may then be heat treated to remove any remaining solvent or enhance certain film properties.

Typically, the dianhydride monomer and diaminobenzoxazole monomer are reacted in a solvent. The solvent typically is a polar, aprotic solvent such as N,N-dimethyacetimide, N-methylpyrrolidinone, 1,3-dimethyl-5-imidazolidinone, N,N-dimethylformamide, 1,1,3,3-tetramethylurea, or N-cyclohexylpyrrolidinone. Mixtures of one or more polar aprotic liquids may also be employed as the solvent. Before shaping of a polyamic acid solution, portions of said solvent can be removed by the application of heat; extracting said solvent using a solvent which is a non-solvent for the polyamic acid; or a combination of both. The temperature to remove the solvent is preferably less than a temperature which will cause imidization of the polyamic acid. The polyamic acid typically binds some of the solvent until imidization, thereby making it difficult to reduce the solvent level by volatilization to below about 10 weight percent.

When the polyamic acid PIBO imidization product is insoluble in the solvent of the polyamic acid solution, the polyamic acid solution prior to imidization is preferably formed into a film. An unsupported film may be formed using a technique involving shear such as extrusion. Shaping the polyamic acid solution to form a film can also be done by coating, casting, dipping or spraying the polyamic solution onto an appropriate substrate. An appropriate substrate includes glass, aluminum, stainless steel, silicon, copper, polyimide film, tetrafluoroethylene fluorocarbon polymers (marketed as Teflon™). Often a release agent such as a fluorinated polymer or a silicone oil can be used to facilitate removal of the film from the substrate.

When the polyamic acid PIBO imidization product is soluble in the polyamic acid solution solvent, it is not normally necessary and may not be desirable to form the polyamic acid solution into a film. Thus, the polyamic acid in the polyamic acid solution is first imidized and subsequently formed into a film as described in the previous paragraph.

Regardless of the forming method, imidization of the polyamic acid to PIBO may be carried out by heating or employing a catalyst or combinations thereof. The polyamic acid can be imidized to PIBO by heating the polyamic solution or the polyamic acid solution after removal of some of the solvent. Catalyzing agents can be added to the polyamic acid solution or the polyamic acid solution after removal of some of the solvent. Catalysts which can be employed include dehydration agents such as acetic anhydride, propionic anhydride, ketene and isobutyric dianhydride. While these catalysts can be employed alone they are most preferably employed with an organic base, preferably those which do not form inorganic salts. Examples include picoline, pyridine, isoquinoline, triethylamine, lutidine or their mixtures. The application of heat or addition of catalysts may occur before or after a film has been formed.

In this invention, the use of heat is preferred to imidize the polyamic acid to PIBO. In particular and surprisingly, a heating process resulting in PIBO films with enhanced tensile strength and percent elongation is more preferably used. In general, the process involves the following heating steps. First, the film is imidized at a temperature from about 185° C. to about 280° C., more preferably from about 185° C. to 240° C. and most preferably about 230° C., for a time of at least 5 minutes and no more than about 90 minutes, more preferably from about 10 to about 80 minutes and most preferably from about 15 to about 75 minutes in air or an inert atmosphere that is preferably moisture free. Subsequently, the imidized film is preferably further heat treated to improve the PIBO properties by heating the film from about 250° C., preferably from about 300° C. to a temperature which is less than about 600° C. and less than the glass transition temperature of the resultant PIBO for at least 10 seconds. More preferably the further heat treatment is performed at a lower temperature from about 250° C. to about 350° C. in air or an inert atmosphere, and then at a second higher temperature from about 350° C. to about 500° C. in air or an inert atmosphere. The inert atmosphere is most preferably nitrogen.

After a PIBO film has been made, an electrically conductive layer must be adhered to said PIBO film forming, for example, a sheet, panel or processed panel. The PIBO film having an adhered electrically conductive layer can then be fabricated into a PWB.

An electrically conductive layer can be adhered to a PIBO film by directly forming a polyamic acid film on an electrically conductive foil and subsequently imidizing the polyamic acid solution to form a PIBO film. Preferably the foil is copper, aluminum or alloys thereof. The foil then functions as the electrically conductive layer of the PIBO film of this invention. The adhesion of the PIBO film to the foil can be enhanced by use of an adhesion promoter such as 3-aminopropyltriethoxysilane.

An electrically conductive layer can also be applied to a PIBO film by techniques such as vapor deposition, electroless plating, electroplating, sputtering and combinations thereof. Vapor deposition, sputtering, and electroplating are described in *Electronic Packaging and Production*, May, 1992, pages 74–76. Vapor deposition, sputtering, electroplating, and electroless plating are described in more detail in *Handbook of Tribology Materials, Coatings, and Surface Treatments*, B. Bhushan & B. K. Gupta, Chapters 9–10, McGraw-Hill, Inc., 1991.

Often a seed metal/metal oxide layer(s) may be applied to the PIBO film to enhance adhesion of subsequent deposited layers. Examples of seed metal/metal oxides include nickel, chrome, titanium, chromium, iron, molybdenum or zirconium and is applied first to enhance adhesion of subsequent metal deposits such as copper. The seed layer can be applied by several techniques such as electroless plating, sputtering and vapor deposition. The PIBO film surface can also be treated chemically, plasma or ion treated to enhance the adhesion of the electrically conductive layer or seed layer to the PIBO surface.

In vapor deposition, material is evaporated under vacuum by a heat source such as resistance heating, LASER, and plasma, then the material is condensed on the PIBO film. The technique is relatively fast but is preferably limited to a layer thickness of up to 0.2 micron. A thicker layer can be deposited by electroplating or electroless plating over the vapor deposited layer. The PIBO film adhesion can be enhanced by the same treatments previously described.

Sputtering involves putting the PIBO film in a vacuum chamber in which a material to be deposited functions as a cathode in a vacuum tube. The cathode is bombarded by ions from a gas and the subsequent liberated material ions are deposited on the PIBO. This deposition method typically results in coatings of about 500 nanometers or less on the PIBO film. A thicker electrically conductive layer can be deposited by electroless plating over the deposited layer. Again the PIBO surface can be pretreated as described previously.

In electroplating a metal film on the PIBO film, the process typically begins with a surface treatment such as a chemical, plasma and ion pretreatment of the PIBO film, followed by deposition of a thin seed metal/metal oxide barrier by techniques which include those described hereinbefore. Metal is then continuously electroplated onto the seed metal layer to the desired thickness. Typically, the metal is plated from an aqueous solution of a salt containing ions of the element (metal) being deposited by passing an electric current through said solution, wherein the PIBO acts as the cathode and the anode is the metal being deposited. The metal can be continuously electroplated by unrolling a long roll of PIBO film and passing said film sequentially through the aqueous solution.

An electroless plating process (chemical reduction deposition) may be used to adhere an electrically conductive layer to the PIBO film. The PIBO can be pretreated as described in the preceding paragraph. The electrically conductive layer, preferably being copper, is plated onto the PIBO from a bath which is typically aqueous. The bath typically contains: a metal salt; a reducing agent; complexing agents; buffering agents; accelerators and inhibitors. The metal salt is the source of the metal. The reducing agent supplies electrons for the reduction of metal ions produced by dissolving metal salts in water. Complexing agents control the free metal available to the reaction. Buffering agents maintain pH of the bath during the process. Accelerators help increase the speed of the reaction. Inhibitors help control the reduction reaction. Heat is also commonly applied to facilitate the deposition process. Commonly, copper sulfate ($CuSO_4$) is used as the salt and formaldehyde is used as the reducing agent.

Another method which may be used to adhere an electrically conductive layer, preferably copper, aluminum or alloys thereof to the PIBO film, is to bond a foil of said metals to the PIBO film using an adhesive. Suitable adhesives include epoxy, cyanate ester, polyimide, and polyamic acid. The adhesive can be in the form of a liquid, powder or a film. The adhesive can be applied to the metal foil, PIBO film or both. The adhesive can be applied by casting, dipping, spraying or pressing. The PIBO and metal foil can be adhered together by laminating said foil and film by applying heat and pressure.

After the PIBO film has been adhered to an electrically conductive layer, the PIBO film and adhered layer can be sliced into a specific size creating, for example, a panel or a processed panel. Slicing can be accomplished by methods such as laser cutting, mechanical sawing and waterjet cutting.

A PWB having at least one PIBO dielectric layer can be a single-sided, double-sided or a multilayer PWB. For a single-sided and double-sided PWB, the PWB has a PIBO dielectric layer and one or two circuitry layers, respectively, wherein the circuitry layer(s) provide the means for component mounting and/or interconnection, connection to external devices, power, and/or ground. The PIBO dielectric layer provides the means for electrical insulation between circuitry layers and/or circuitry layer features while also providing mechanical support for the PWB.

The PWB of this invention can be rigid or flexible. Generally a multilayer PWB having a PIBO dielectric layer will be substantially rigid. Single-sided and double-sided PWB having a PIBO dielectric layer may be flexible.

Because the PWB of this invention contains a PIBO dielectric layer, it is possible for the circuitry layer to be less than about 50 microns thick and more preferably less than about 17 microns. For the same reason, this invention advantageously allows the circuitry layer to have one or more desirable circuitry features such as at least one conductor line width of less than about 100 microns, at least one conductor spacing of less than about 100 microns, at least one annular hole ring width between about 200 microns to a landless annular hole ring (0 microns) and at least one via diameter less than about 200 microns. Said circuitry layer and/or features are preferably adhered to said PIBO layer. Preferably the circuitry layer is copper, aluminum or alloys thereof.

The single or double-sided PWB of this invention may be formed by any convenient process. For example, said single or double-sided PWB may be fabricated by the photoresist/etching process as described previously for a double-sided PWB which can also be used with little modification to form a single-sided PWB if desired. The single or double-sided PWB of this invention is not limited by any particular method to produce said single or double-sided PWB.

In a multilayer PWB of this invention, the PWB consists of multiple alternating dielectric layers and circuitry layers which are connected by at least one via. The simplest multilayer PWB has three circuitry layers and two dielectric base material layers. PWBs with ever increasing number of layers are becoming more common and may be advantageously achieved by this invention.

In the multilayer PWB of this invention, circuitry layers comprising the outer faces of the PWB typically provide places to mount electronic components such as IC chips, resistors and capacitors and electrically connect said components. The circuitry layer(s) in the interior of the PWB typically provides electrical connections between the mounted components, external devices, power and ground. The base material layer(s) typically provides rigidity (mechanical support) to the PWB, electrical insulation between circuitry layers and electrical insulation between conductors of a circuitry layer. The dielectric adhesive layer(s) typically provides bonding between circuitry layers, electrical insulation between circuitry layers and electrical insulation between conductors of a circuitry layer.

Because PIBO is not a thermoset or thermoplastic polymer, it generally will not be used as an adhesive dielectric layer. Thus, in the multilayer PWB of this invention, the PIBO will typically be a base material layer and some other material will be the adhesive dielectric layer. However, a polyamic acid which forms a PIBO upon imidization may be used as an adhesive during the production of a multilayer PWB, consequently forming a PIBO adhesive dielectric layer. A PIBO film that has been coated with an adhesive may also be used to laminate layers together in a multilayer PWB process, subsequently forming a PIBO dielectric adhesive layer. The dielectric adhesive layer may be any material displaying good adhesion to the circuitry layer and PIBO after lamination. Preferably, the adhesive dielectric layer has a dielectric constant approaching the dielectric constant of the PIBO layer and is preferably less than about 4.5. A dielectric adhesive layer derived from an adhesive such as epoxy, cyanate ester, and polyimide may be used. Said adhesive layers may have a filler such as ceramic particulates or fibers. Preferably two PIBO processed panels can be adhesively bonded by an adhesive layer less than 130 microns and more preferably less than 50 microns thick.

The PWB of this invention desirably survives IPC 650 2.6.6B test, which describes reliability of a PWB thermal cycled between −55° to 125° C.

The multilayer printed wiring board of this invention may be formed by a process involving laminating two or more processed panels having circuitry layers on both sides, wherein at least one of the processed panels has a PIBO base material layer. The processed panels are usually laminated together using an adhesive described previously. The adhesive may be a dry powder, a liquid, a film or a paste. Preferably the adhesive is in the form of a film (prepreg). The PIBO processed panel can be treated to enhance adhesion of an adhesive layer. Treatments can include hand cleaning using pumice, plasma, chemical or coating treatments. Alternating layers of the processed panels and prepregs are placed in a die. In addition to the processed panels and prepregs, it is common to have a prepreg and then a metal foil layer (typically copper) as the bottom and top layers in the die. The prepregs, processed panels and metal foil are laminated by applying heat and pressure to the die. After laminating, the prepreg and foil create an outer cladding on the laminate. The laminate is then processed by any convenient method to create the outer circuitry layers which are ready to mount electronic components. The creation of the outer layers may include drilling of vias which can be accomplished by techniques such as mechanical drilling, LASER drilling, or plasma ablation. Finally, if the laminated processed panels contain more than one multilayer PWB, the PWBs may be finished by slicing the laminated processed panels by techniques previously described for slicing processed panels.

A preferred embodiment of this invention is a PWB having at least one dielectric layer which is PIBO, wherein the PWB has a circuit density of at least 160 leads per square inch. Another most preferred embodiment is an MCM having surface mounted electronic components (ICs), wherein the PWB has at least one PIBO dielectric layer and the circuit density of said PWB is greater than 160 leads per square inch.

Where examples of the invention are described hereinafter, it is intended that these examples illustrate rather than limit the general nature of the invention.

EXAMPLES

Forming a PIBO Film and Adhering an Electrically Conductive Layer to the PIBO Film

Example 1A

Into a 3 neck, 25-mL round-bottom flask equipped with agitation means an a Dean-Stark trap with a condenser is fed 230 mL of N-methylpyrrolidinone (NMP) and 40 mL of toluene. The flask is gently purged by nitrogen. Toluene is distilled off. Into the stirred room temperature solvent is added 12.976 g of 5-amino-2-(p-aminophenyl)benzoxazole (pDAMBO) and 12.565 g of pyromellitic dianhydride (PMDA) rinsed with 10.0 mL dry DMAc. After 68 hours at room temperature, the resulting polyamic acid is diluted with N-methylpyrrolidinone (NMP) and has an inherent viscosity of 3.73 g/dL.

To a dry, 3 neck, 250 mL round-bottom flask having a nitrogen atmosphere and equipped with agitation means and inlet and outlet adaptors is added about 80 grams of the above polyamic acid solution. About 12.1 mL of a dry mixture of 60 percent 1,3-dimethylimidazolidinone and 40 volume percent N-methylpyrrolidinone (DMI/NMP) is added to the flask and stirred overnight at room temperature. The flask is chilled by an ice bath and degassed by aspirator vacuum. The flask is brought back to atmospheric pressure with nitrogen.

A 12.5 weight percent solution of the resulting polyamic acid is cast on glass as a 25 micron film. The film is heated in an air circulating oven at 60° C. for 45 minutes, removed from the glass and secured in an aluminum frame. It is then placed in an air-circulating oven, heated for 20 minutes at 225° C., for 20 minutes to 300° C., maintained for 1 hour at 300° C., then cooled to room temperature; and in a nitrogen atmosphere, heated for 27 minutes at 30° C. (nitrogen purge cycle), 75 minutes to 400° C., maintained at 400° C. for 12 hours, and then cooled to room temperature.

The above procedure is repeated to produce a 51 micron film.

The film's tensile strength is 308 MPa, its tensile modulus is 11 GPa, and its elongation at break is 8.5 percent.

Example 1B

The following procedure is used to make a PIBO film having one face clad by a 9 micron thick copper cladding. A 25 micron PIBO film made by the procedure of Example 1A is chemically treated for 45 to 75 seconds in a homogeneous aqueous solution having 45 weight percent potassium hydroxide, 10 weight percent ethylene diamine, and 10 weight percent ethylene glycol. This process reduces the film thickness by about 10 percent and makes the film surface more easily wetted so as to enhance adhesion of subsequent deposited layers. A nickel seed layer several microns thick is applied to the chemically treated PIBO film. The nickel is applied by electroless plating. After the nickel seed layer is applied, a copper layer is deposited by electroplating in an acid copper sulfate bath at about 30 amps per square foot for 45 minutes per 0.5 ounce per square foot of plating over the nickel seed layer.

The procedure of Example 1B is repeated to make a 25 microns thick PIBO film cladded by 17 microns thick copper on one face. The procedure of Example 1B is repeated to make a 25 microns thick PIBO film cladded by 35 microns thick copper on one face. The procedure of Example 1B is repeated to make a 51 microns thick PIBO film cladded by 9 microns thick copper on one face. The procedure of Example 1B is repeated to make a 51 microns thick PIBO film cladded by 17 microns thick copper on one face. The procedure of Example 1B is repeated to make a 51 microns thick PIBO film cladded by 35 microns thick copper on one face.

The procedure of Example 1B is repeated to make a 25 microns thick PIBO film cladded by 9 microns thick copper on both faces. The procedure of Example 1B is repeated to make a 25 microns thick PIBO film cladded by 17 microns thick copper on both faces. The procedure of Example 1B is repeated to make a 25 microns thick PIBO film cladded by 35 microns thick copper on both faces. The procedure of Example 1B is repeated to make a 51 microns thick PIBO film cladded by 9 microns thick copper on both faces. The procedure of Example 1B is repeated to make a 51 microns thick PIBO film cladded by 17 microns thick copper on both faces. The procedure of Example 1B is repeated to make a 51 microns thick PIBO film cladded by 35 microns thick copper on both faces.

Example 1C

The following procedure is used to make a PIBO film having one face clad by a 9 micron thick copper cladding. To enhance adhesion of subsequent deposited layers, the PIBO film of Example 1A is treated using a plasma generated by an MRC 603 sputtering system using an argon or argon/oxygen gas flow of 75 standard cubic centimeters/ minute (SCCM) at 75 to 125 millitorr pressure for 5 to 30 minutes at an RF power of 500 watts. A seed layer of copper about 1000 Angstroms thick is sputter deposited onto the plasma treated PIBO film. A thicker layer of copper (about 9 microns) is deposited over the sputtered copper layer by electroplating in a standard acid copper sulfate bath at about 30 amps per square foot for 45 minutes per 0.5 ounce per square foot of plating.

The procedure of Example 1C is repeated to make a 25 microns thick PIBO film cladded by 17 microns thick copper on one face. The procedure of Example 1C is repeated to make a 25 microns thick PIBO film cladded by 35 microns thick copper on one face. The procedure of Example 1C is repeated to make a 51 microns thick PIBO film cladded by 9 microns thick copper on one face. The procedure of Example 1C is repeated to make a 51 microns thick PIBO film cladded by 17 microns thick copper on one face. The procedure of Example 1C is repeated to make a 51 microns thick PIBO film cladded by 35 microns thick copper on one face.

The procedure of Example 1C is repeated to make a 25 microns thick PIBO film cladded by 9 microns thick copper on both faces. The procedure of Example 1C is repeated to make a 25 microns thick PIBO film cladded by 17 microns thick copper on both faces. The procedure of Example 1C is repeated to make a 25 microns thick PIBO film cladded by 35 microns thick copper on both faces. The procedure of Example 1C is repeated to make a 51 microns thick PIBO film cladded by 9 microns thick copper on both faces. The procedure of Example 1C is repeated to make a 51 microns thick PIBO film cladded by 17 microns thick copper on both faces. The procedure of Example 1C is repeated to make a 51 microns thick PIBO film cladded by 35 microns thick copper on both faces.

All of the claddings of the above examples passed IPC-TM-650, Method 2.4.9 adhesion test.

Formation of a PIBO Multilayer PWB

Example 2

A 63.5 mm×48mm×0.18 mm multilayer PWB having 4 circuitry layers and 3 dielectric layers is made in which the dielectric layers are PIBO. The multilayer PWB includes: 76 microns wide conductors; 76 microns wide conductor spacings; 152 microns pitch and via hole diameters of 203, 305, and 508 microns.

The PWB is created by the following procedure. The cladding of two 9 microns thick copper single-faced cladded 25 microns thick PIBO films of Example 1B are coated with Dupont Riston 9015™ photoresist, masked by an artwork photo tool and exposed to UV light. The resist is developed in a 2 weight percent sodium carbonate aqueous solution. The copper not protected by the photoresist is etched away by a sulfuric-peroxide solution. The remaining photoresist is etched away using a caustic solution and then the surfaces are further cleaned by hand using pumice. Each PIBO film now has one face having a circuitry layer (PIBO-circuitry film).

The 2 PIBO-circuitry films, 2 copper foils and 3 plasma etched PIBO films in which each face has been joined to an epoxy adhesive film (PIBO epoxy adhesive film) are placed in a lamination fixture. The layers are stacked in the lamination fixture as follows: (1st layer) copper foil; (2nd layer) PIBO epoxy adhesive film; (3rd layer) PIBO-circuitry film; (4th layer) PIBO epoxy film; (5th layer) PIBO-circuitry film; (6th layer) PIBO epoxy adhesive film and (7th layer) copper foil. The circuitry layers of the PIBO-circuitry films are facing the 4th layer in the stack. The fixture and stack are placed in an elastomeric bag which is evacuated. The stack is laminated by placing the evacuated bag in a preheated press and pressing at 400 psi at 340° F. for one hour.

Holes are drilled in the laminate using a drill rotating at 110,000 rpm. Hole diameters of 203, 305 and 508 microns are drilled. For the 305 and 508 microns holes, the laminate is covered with an aluminum/phenolic material to minimize damage to the laminate upon drill entry. The drilled holes are then plasma etched to remove debris and desmear the epoxy adhesive. Vias are created by electroless plating copper in the holes followed by electroplating copper to a thickness of 2.5 microns.

The outer copper layer is coated with the Dupont photoresist, masked with another photo tool and exposed to UV light. The photoresist is developed using 2 weight percent sodium carbonate aqueous solution leaving areas of exposed copper. The exposed copper is plated with 3 microns of copper by electroplating which is then overlaid by etch resist consisting of 2.5 microns of nickel and then 0.25 micron of gold deposited by an electroplating process. The copper having photoresist is removed by a sulfer-peroxide etchant. The copper coated with etch resist remains making up the outer circuitry layer. To the outer circuitry layers, a solder mask is added to protect the outer circuitry features which will not be used to mount electronic components such as lines The same multilayer PWB is formed by procedure of Example 2 and is repeated for two 9 microns thick copper single-faced cladded 25 microns thick PIBO films of Example 1C.

What is claimed is:

1. A polyimidebenzoxazole (PIBO) film having an electrically conductive layer adhered to at least one face thereto wherein the PIBO film has a tensile strength greater than about 200 MPa at 25° C. and an elastic modulus greater than about 0.5 GPa at about 25° C.

2. The polyimidebenzoxazole (PIBO) film of claim 1 wherein the PIBO film is less than about 150 microns thick.

3. The polyimidebenzoxazole (PIBO) film of claim 1 wherein the PIBO film is less than about 50 microns thick.

4. The polyimidebenzoxazole (PIBO) film of claim 1 wherein the electrically conductive layer is less than about 50 microns thick.

5. The polyimidebenzoxazole (PIBO) film of claim 4 wherein the electrically conductive layer is less than about 17 microns thick.

6. The polyimidebenzoxazole (PIBO) film of claim 1 wherein the electrically conductive layer is selected from the group consisting of copper, aluminum or alloys thereof.

7. The polyimidebenzoxazole (PIBO) film of claim 1 wherein the polyimidebenzoxazole (PIBO) film is selected from the group consisting of:
   a) the reaction product of pyromellitic dianhydride and 5-amino-2-(p-aminophenyl) benzoxazole;
   b) the reaction product of pyromellitic dianhydride and 2,6-(4,4'-diaminodiphenyl) benzo[1,2-d:5,4-d'] bisoxazole; and
   c) the reaction product of pyromellitic dianhydride and 2,2'-p-phenylene-bis(5-aminobenzoxazole).

8. The polyimidebenzoxazole (PIBO) film of claim 1 wherein the polyimidebenzoxazole (PIBO) film at about 25° C. has a tensile strength greater than about 250 MPa.

9. The polyimidebenzoxazole (PIBO) film of claim 8 wherein the polyimidebenzoxazole (PIBO) has a tensile strength greater than about 300 MPa at about 25° C.

10. The polyimidebenzoxazole (PIBO) film of claim 1 wherein the polyimidebenzoxazole (PIBO) film has a permanent lateral deformation of less than about 0.02 percent as determined by IPC 650 2.2.4A.

11. The polyimidebenzoxazole (PIBO) film of claim 1 wherein the polyimidebenzoxazole (PIBO) film has a coefficient of thermal expansion (CTE) in the XY direction between about 1 and 7 ppm per ° C. from about −55° to about 125° C.

12. The polyimidebenzoxazole (PIBO) film of claim 1 wherein the polyimidebenzoxazole (PIBO) polymer film has a CTE of less than about 100 ppm per ° C. in the Z direction from about −55° to about 125° C.

13. The polyimidebenzoxazole (PIBO) film of claim 1 wherein the polyimidebenzoxazole (PIBO) film has an elastic modulus greater than about 5 GPa at about 25° C.

14. The polyimldebenzoxazole (PIBO) film of claim 1 wherein the electrically conductive layer is bonded directly to the PIBO film.

15. The polyimidebenzoxazole (PIBO) film of claim 1 wherein the electrically conductive layer is adhered to the PIBO film by means of an adhesive.

16. The polyimidebenzoxazole (PIBO) film of claim 1 wherein the film is in the form of a panel or processed panel.

17. A printed wiring board having at least one dielectric layer and at least one circuitry layer wherein at least one dielectric layer is a polyimidebenzoxazole (PIBO) film having a tensile strength of at least 200 MPa at 25° C. and said printed wiring board passes thermal cycling test IPC 650 2.6.6B.

18. The printed wiring board of claim 17 wherein the printed wiring board is a single-sided printed wiring board.

19. The printed wiring board of claim 17 wherein the printed wiring board is a double-sided printed wiring board.

20. The printed wiring board of claim 17 wherein the printed wiring board is a multilayer printed wiring board.

21. The printed wiring board of claim 20 wherein the multilayer printed wiring board has at least one dielectric adhesive layer, wherein the dielectric adhesive layer is an adhesive selected from the group consisting of:
   a) epoxy;
   b) polyimide;
   c) cyanate ester;
   d) polyamic acid and e) PIBO film having an adhesive joined to at least one face.

22. The printed wiring board of claim 20 has a circuit density of greater than 160 leads per square inch.

23. The printed wiring board of claim 22 which is a multichip module (MCM) that has at least two surface mounted ICs.

24. The printed wiring board of claim 17 wherein the dielectric layer is PIBO, said dielectric layer has a thickness of less than about 150 microns.

25. The printed wiring board of claim 24 wherein the dielectric layer is PIBO, said dielectric layer has a thickness of less than about 50 microns.

26. The printed wiring board of claim 17 wherein at least one circuitry layer is less than about 50 microns thick.

27. The printed wiring board of claim 17 wherein at least one circuitry layer is less than about 17 microns thick.

28. The printed wiring board of claim 17 wherein at least one circuitry layer is selected from the group consisting of copper, aluminum or alloys thereof.

29. The printed wiring board in claim 17 wherein said dielectric layer has a dielectric constant between about 2 and 3.3 over a frequency range of about 1 KHz to 1 GHz.

30. The printed wiring board of claim 17 wherein at least one circuitry layer has at least one conductor having a line width of less than about 100 microns.

31. The printed wiring board of claim 17 wherein at least one circuitry layer has at least two conductors having a conductor spacing of less than about 100 microns.

32. The printed wiring board of claim 17 wherein at least two of the conductive circuitry layers have at least one interconnecting via having a diameter of less than about 200 microns.

33. The printed wiring board of claim 17 wherein at least one circuitry layer has at least one annular hole ring having a width between 0 and about 200 microns.

* * * * *